United States Patent

Jang et al.

[11] Patent Number: 5,939,149
[45] Date of Patent: Aug. 17, 1999

[54] METHOD OF FORMING HYDROGEN-FREE DIAMOND LIKE CARBON (DLC) FILMS

[75] Inventors: Jin Jang; Kyu Chang Park, both of Seoul, Rep. of Korea

[73] Assignee: Orion Electric Co., Ltd., Rep. of Korea

[21] Appl. No.: 08/860,770

[22] PCT Filed: Nov. 2, 1996

[86] PCT No.: PCT/KR96/00192

§ 371 Date: Jul. 2, 1997

§ 102(e) Date: Jul. 2, 1997

[87] PCT Pub. No.: WO97/16580

PCT Pub. Date: May 9, 1997

[30] Foreign Application Priority Data

Nov. 2, 1995 [KR] Rep. of Korea ............ 95-39256

[51] Int. Cl.[6] .............. B05D 3/06; C23C 16/26; H05H 1/00
[52] U.S. Cl. .......... 427/535; 427/534; 427/577; 427/249; 427/255.7
[58] Field of Search .............. 427/534, 535, 427/577, 255.7, 249, 122

[56] References Cited

U.S. PATENT DOCUMENTS 4,647,494  3/1987  Meyerson et al. .
5,431,963  7/1995  Rzad et al. .

FOREIGN PATENT DOCUMENTS 0427294    5/1991   European Pat. Off. .
0 600 533 A1  6/1994   European Pat. Off. .
61-231180  10/1986   Japan .
01-062484   3/1989   Japan .

OTHER PUBLICATIONS

Chang et al, Appl. Phys. Lett. 68(25) June. 1996, pp. 3594–3595.
Applied Physics Letters vol. 58, No. 4, Jan. 28, 1991, New York pp. 358–360 T.P. Ong et al 'properties of diamond composite films grown on iron substrate'.
Dianond and Related Materials vol. 1, 1992, Amsterdam pp. 553–557.

*Primary Examiner*—Roy V. King
*Attorney, Agent, or Firm*—Fulbright & Jaworski L.L.P.

[57] ABSTRACT

The present invention relates to a method for forming substantially hydrogen free DLC layers, wherein DLC layer of thickness about 1 to 100 nanometers is deposited over a sample substrate or a field emitter array and subsequently exposed to etching plasma comprising fluorine gas, wherein during the latter step, hydrogen contained in the substrate is eliminated by chemical etching reaction with fluorine, wherein steps to form the hydrogen free DLC layer can be repeated to obtain a predetermined thickness of a DLC film.

10 Claims, 8 Drawing Sheets

METHOD OF FORMING HYDROGEN-FREE DIAMOND LIKE CARBON (DLC) FILMS

This application is a 371 of PCT International Application No. PCT/KR96/00192 filed Nov. 2, 1996.

TECHNICAL FIELD

The present invention relates to a method of forming Diamond-Like Carbon ("DLC") film, particularly substantially hydrogen free DLC film, using the Plasma Enhanced Chemical Vapor Deposition ("PECVD") method, and the DLC film formed thereby. The present invention also relates to use of the same as field emission cathodes of a field emission display as well as to a field emitter array coated with the DLC film and field emitter cathodes comprising the DLC film.

BACKGROUND ART

In general, DLC without incorporated hydrogen has considerable interest, due to its higher $sp^3$ fraction compared to its hydrogenated counterpart; see, for example, V. S. Veerasamy et al., Solid-State Elec. 37,319 (1994); D. R. Mckenzie et al., Thin Solid Films 206,198 (1991); and K. K. Chan et al, Thin Solid Films 212,232 (1992). DLC film possessing negative electron affinity ("NEA") characteristics, have great potential in their application as electron emitters in vacuum microelectronics and have, as such, attracted extensive studies; see, for example, M. W. Geis et.al, IEEE ED Lett. 12,456 (1991); N. S. Xu et al., Electron. Lett., 29,1596 (1993). The interest for the DLC as an emission material results from its unique emission properties; low-field cold emission and emission stability. In addition, the excellent thermal conductivity of the DLC anticipates high maximum currents to be obtained from the DLC film coated emitters. As could be known from these references, DLC film is typically used as an field emitter material for a Field Emission Display ("FED"). In general, FED comprises emission cathodes and a glass face plate coated with phosphors on transparent conducting oxide. In operation, the face plate is held at a high positive voltage. When a color element is addressed, electrons from a cold cathode array bombard the corresponding phosphor element to produce a bright light in the same manner as in a conventional television picture tube. At the present time, diamond, DLC and, crystalline Si, metals such as Mo are mostly adopted as materials for the FED tip. However, using of metals or Si as tip material has the problems such as low durability, high driving voltage due to high work function compared with DLC or diamond. Further, dispersion of electron and particles causes difficulty in maintenance of high vacuum below $10^{-7}$ Torr, as well as oxidization of the tip. The chemical inertness, the hardness, and especially the low work function of the DLC make it an excellent electron emitting material for the FED.

Cold cathode electron emitters obtained by depositing diamond films on Si tips, Mo tips, or W tips are also widely discussed. The field strength needed for electron emission has been reduced to less than $3 \times 10^4$ V/cm, which is substantially lower than the field strength required in the conventional metal tips Field Emission Array ("FEA"), as $>1 \times 10^6$ V/cm.

Heretofore, the DLC film deposited by PECVD method has higher hydrogen content, typically higher than 20 at. %; see, A. Dekempeneer et al., Thin Solid Films 217,56 (1992). The incorporated hydrogen reduces $sp^3$ fraction in the film, resulting in reduction of film hardness. Hydrogen free DLC can be obtained by filtered vacuum arc deposition or by ion beam deposition; see for example, S. Aisenberg et al., Appl. Phys. 42,2953 (1971). Mckenzie et al., deposited hydrogen free DLC with more than 85% $sp^3$ fraction by a filtered vacuum arc deposition; see, Mckenzie et al., Phys. Rev. Lett. 67,773 (1991). A typical filtered vacuum arc discharge method is characterized in depositing carbon ions formed by arc discharge by applying magnetic field and electric field to said carbon ions. However, it is not easy to get a uniform deposition in large area by this method.

FIG. 1 shows a prior art process for DLC layer forming by using PECVD method. Deposition plasma comprising methane (other carbon hydrides gases can also be used), hydrogen and helium is used in this method. However, in this method, radicals containing hydrogen are formed in the course of decomposing the methane which is included in the deposition plasma, causing a subject sample to inevitably contain hydrogen.

DISCLOSURE OF INVENTION

Therefore, it is an object of the present invention to provide a method to form uniform substantially hydrogen free DLC deposition on a large area.

In the present invention, the substantially hydrogen free DLC layer is formed by depositing a thin DLC layer and subsequently exposing its surface to etching plasma. This will be referred to as layer-by-layer deposition method hereinafter.

According to the present invention, the DLC layer of thickness about 1 to 100 nanometers is first deposited over a sample substrate. Then the surface of said DLC layer is exposed to etching plasma. During the latter step, hydrogen contained in the substrate is eliminated by chemical annealing (or etching). This results in a substantially hydrogen free DLC layer. The characteristics of the DLC layer can advantageously be changed by altering its exposure time to the etching plasma.

Any plasma with chemical etching reaction can be used as the etching plasma. The etching plasma can preferably comprise fluorine, more preferably carbon fluorides.

According to another respect of the present invention, the DLC layer is formed over Metal tips.

BRIEF DESCRIPTION OF THE DRAWINGS

The object and advantages of the present invention will be more clearly understood to those skilled in the art with reference to the accompanying drawings in which.

BEST MODE FOR CARRYING OUT THE INVENTION

Figure 1A:
FIGS. 1A–1B show a prior art process for forming DLC layer using PECVD method.
Figure 1A:
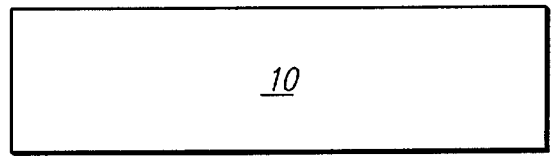
Figure 1B:
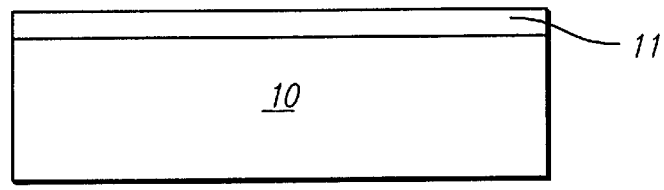
Figure 2A:
FIGS. 2A,2B,2C,2D,2E,2F,2G,2H, and 2I show a process for forming DLC layer according to the present invention.
Figure 2A:
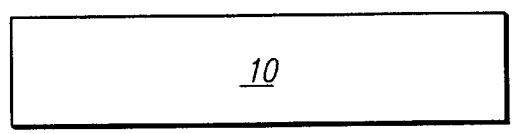
Figure 2B:
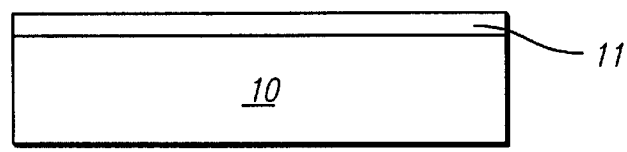
Figure 2C:
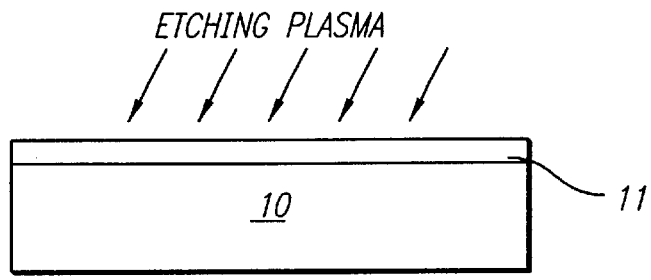
Figure 2D:
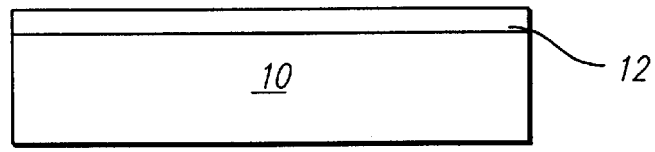
Figure 2E:
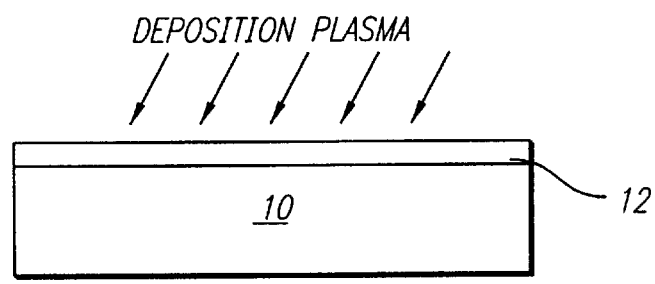
Figure 2F:
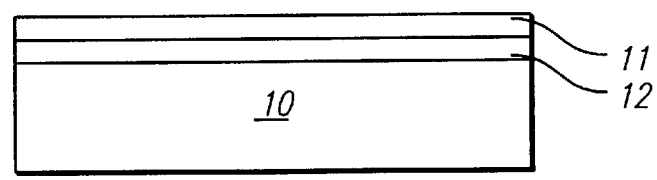
Figure 2G:
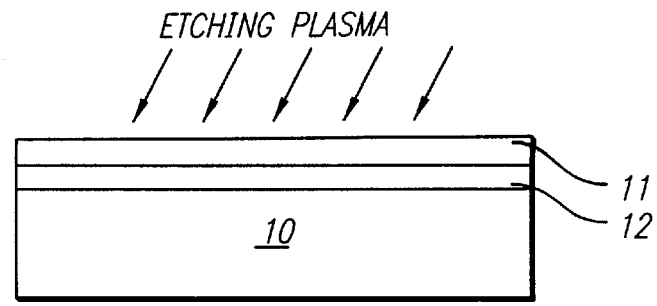
Figure 2H:
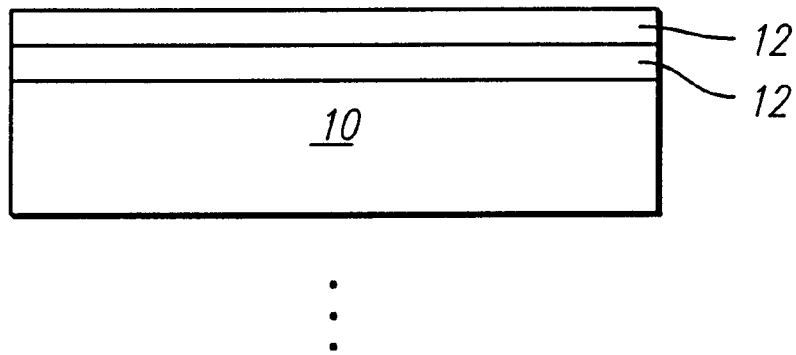
Figure 2I:
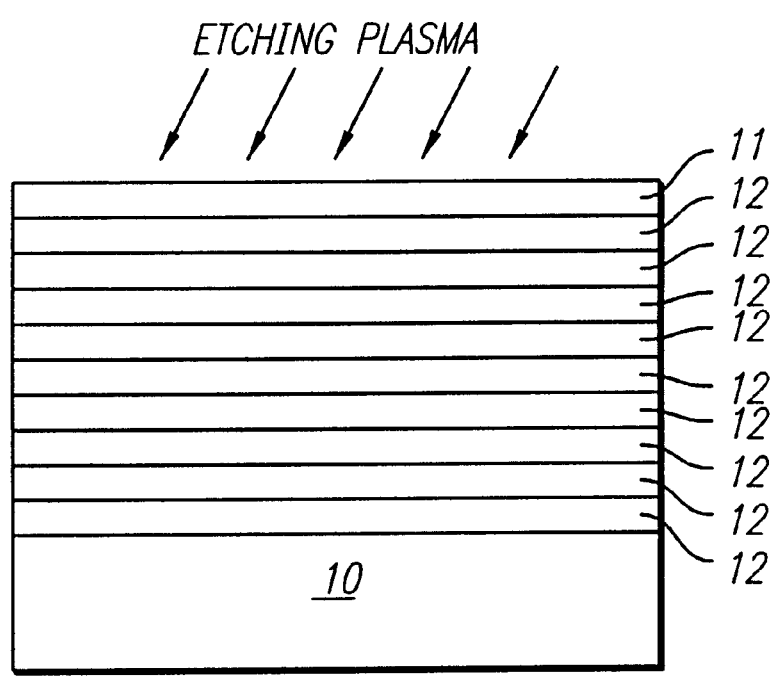

FIG. 2A shows a substrate exposed to deposition plasma to coat it with DLC layer. FIG. 2B shows a DLC layer (11) formed by said deposition. FIG. 2C shows exposing a DLC layer (11) to etching plasma comprising fluoride gas after the deposition of the DLC layer. The characteristics of the sample substrate can advantageously be changed by altering the exposure time to the etching plasma in this step. FIG. 2D shows a first layer (12) of substantially hydrogen free DLC formed by said process. Subsequently, another layer of conventional DLC of thickness about 1 to 100 nanometers is grown (FIG. 2E and FIG. 2F). The step of exposing the sample substrate under the etching plasma to obtain the second substantially hydrogen free DLC layer is shown in the FIG. 2G. The second DLC layer is thus obtained (FIG. 2H). FIG. 2I shows the tenth layer of DLC layer subject to the etching plasma. Steps are repeated to obtain a predetermined number of DLC layers, which in all form a DLC film.

In an example where plasma comprising $CF_4$ is used as the etching plasma, the layer-by-layer deposition method according to the present invention was used to deposit substantially hydrogen free a-Si:H and microcrystalline Si films. In this case, deposition plasma comprising hydrogen was exposed on a thin a-Si:H layer for chemical annealing. Then, $CF_4$ plasma was exposed on a thin DLC layer to remove weak bonds, predominantly C—$H_n$ bonds and graphite C—C bonds. Conventional PECVD method, in which rf power was applied to the substrate holder was used. $CH_4/H_2$/He and $CF_4$/He were introduced for the deposition of DLC layer and the surface treatment, respectively.

Table below depicts the layer-by-layer conditions for the example.

| Condition | Deposition | Plasma Etching |
|---|---|---|
| RF power(W) | 100 | 100 |
| Pressure(mbar) | 0.4 | 0.45 |
| Flow rate(sccm) | | |
| He | 50 | 50 |
| $H_2$ | 5 | 0 |
| $CH_4$ | 1 | 0 |
| $CF_4$ | 0 | 30 |
| Time(s) | 100 | 0~200 |

The flow rates of He and $CF_4$ was fixed at 50 sccm and 30 sccm, respectively for the etching plasma treatment. The thickness of each layer of the DLC and the $CF_4$ plasma exposure time were the two most important parameters to obtain a good quality DLC layer. In the example, the thickness of each layer was fixed at 5 nm and the $CF_4$ plasma exposure time was varied from 0 to 200s. The measured self-bias voltage of the example was found to be −120 V at a fixed rf power of 100 W. The self-bias voltage depends strongly on the gas pressure and rf power.

Figure 3:
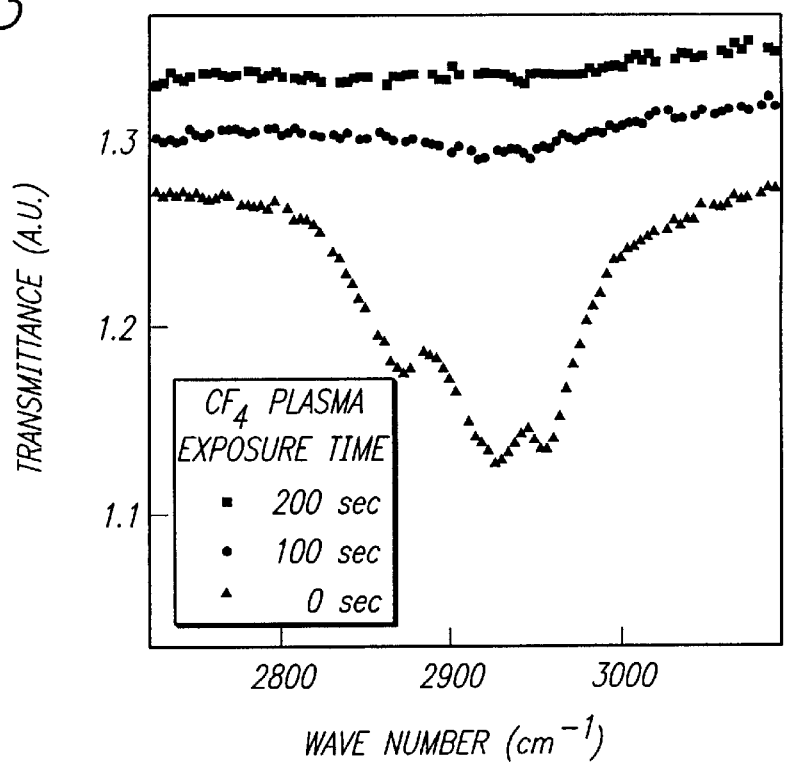
FIG. 3 shows a Fourier Transform-Infrared absorption (FR-IR) spectra for the deposited DLC films.

FIG. 3 shows the FT-IR transmittance spectra of the DLC films. The absorption peaks at 2870 $cm^{-1}$, 2925 $cm^{-1}$ and 2960 $cm^{-1}$ corresponding respectively to $sp^3$ $CH_3$ (symmetrical), $sp^3$ $CH_2$(asymmetrical) and $sp^3$ $CH_3$ (asymmetrical) modes, appear in the FT-IR spectrum for the conventional DLC layer. C—$H_n$ vibration intensity disappears completely when the $CF_4$ plasma exposure time is 200s. This confirms that, it is possible to deposit a substantially hydrogen free DLC layer by PECVD method using the layer-by-layer deposition method according to the present invention.

Figure 4:
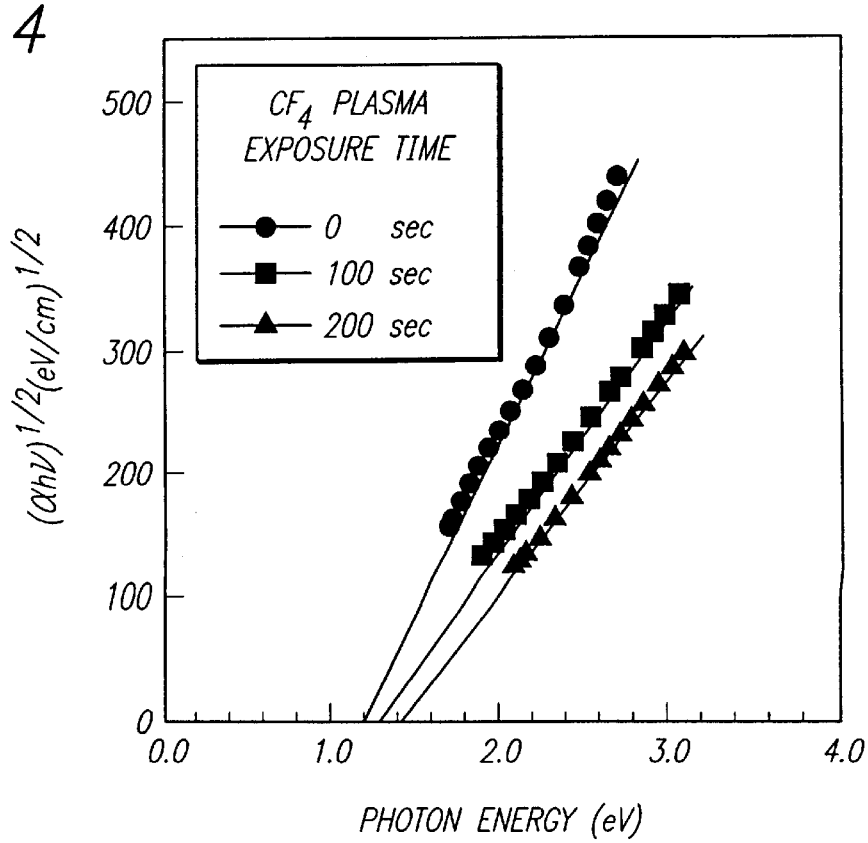
FIG. 4 shows the optical band gap of the DLC film obtained from the Tauc's plot.

FIG. 4 shows the optical band gap ($E_g^{opt}$) of the DLC film obtained from the Tauc's plot. The optical band gap increases from 1.2 eV to 1.4 eV with increasing $CF_4$ plasma exposure time. The increase in optical band gap appears to be caused by the preferential etching of graphite phase in the DLC layer by $CF_4$ plasma exposure. Note that the bond energy of C—C $sp^3$ bond (8.68 eV) is higher than that of C—C $sp^2$(6.33 eV). Therefore, bonding and anti-bonding states of C—C $SP^2$ lie in the inner side of those of C—C $sp^3$. The removal of the $sp^2$ bonds, therefore, results in widening of band gap of DLC.

Figure 5:
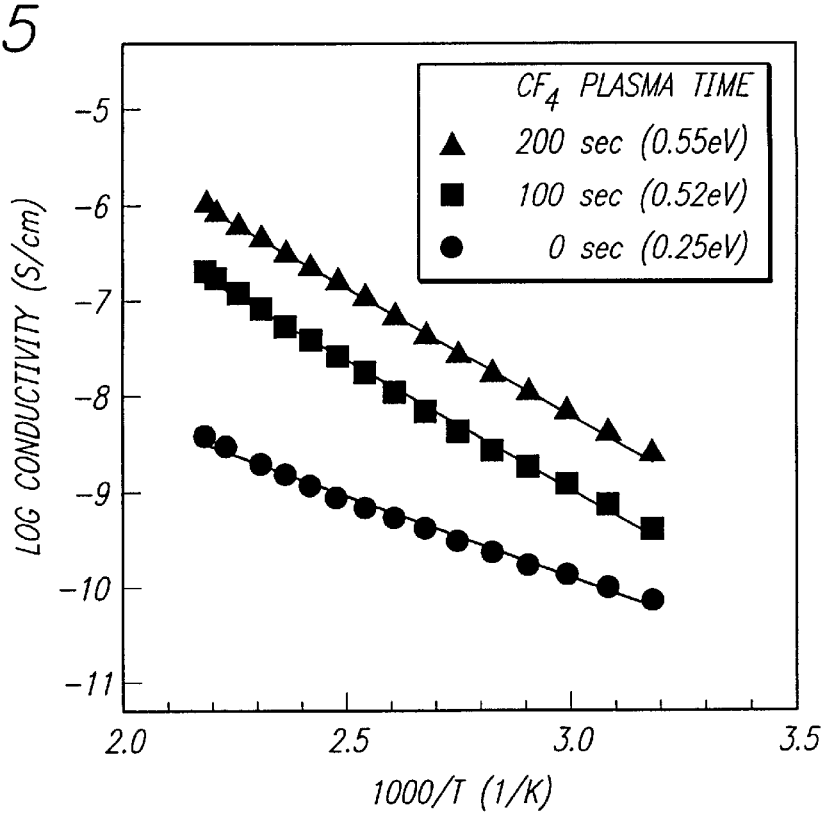
FIG. 5 shows the temperature dependency of dark conductivity of the DLC film.

FIG. 5 shows temperature dependence of dark conductivity for the DLC films. The conductivity of the DLC film shows an activated form and the activation energy increases from 0.25 eV to 0.55 eV with increasing $CF_4$ plasma exposure time up to 200s. This means that the Fermi level moves toward the midgap after the $CF_4$ plasma exposure because optical band gap of the substantially hydrogen free DLC layer is 1.4 eV, which is higher than 2 times of conductivity activation energy. The conventional DLC layer shows characteristics of a p-type behavior and activation energy of conductivity around 0.2 eV. This DLC film according to the present invention indicates relative high value (0.55 eV) of activation energy.

Figure 6:
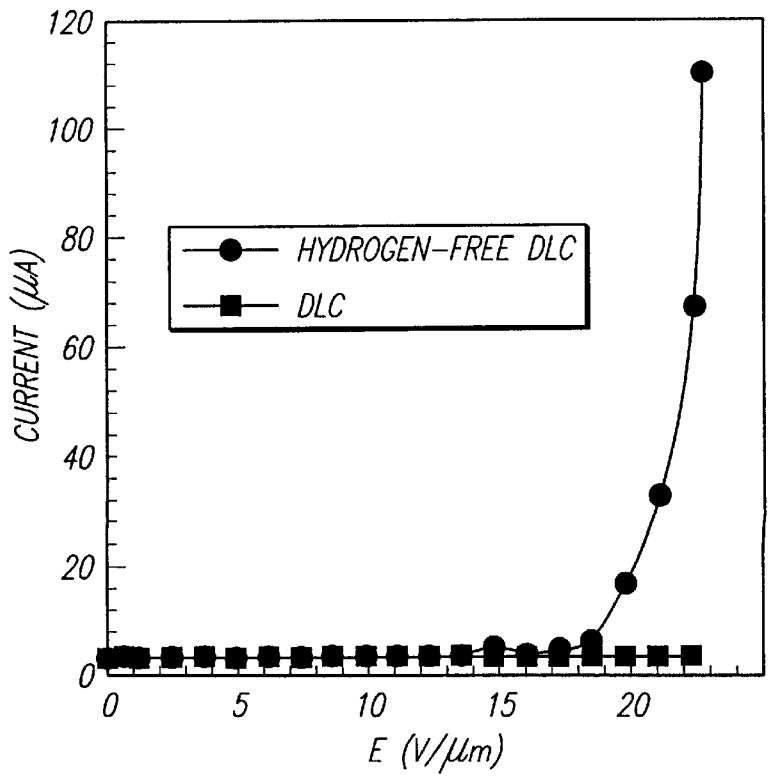
FIG. 6 shows the I-E (current-electric field) characteristics of the DLC film.

FIG. 6 shows the I-E characteristics of the DLC films. The area and thickness of the DLC films were 0.9 $cm^2$ and 100 nm, respectively. Conventional DLC film shows nonemission up to 22 V/$\mu$m. However, layer-by-layer deposited DLC film shows an effective electron emission: the onset field for emission was found to be 18 V/$\mu$m and the emission currents were described by the Fowler-Nordheim (F-N) formula.

The barrier energy for electron emission for the substantially hydrogen-free DLC, calculated from the slope of F-N plot, is 0.06 eV. This indicates that the DLC films has low barrier energy for electron emission.

Layer-by-layer deposition was carried out under different deposition and etching plasma exposure conditions. The flow rates of $CH_4$ and $H_2$ were 6 sccm and 3 sccm, respectively for the DLC deposition and the $CF_4$ flow rate was fixed at 20 sccm for etching plasma treatment.

Figure 7:
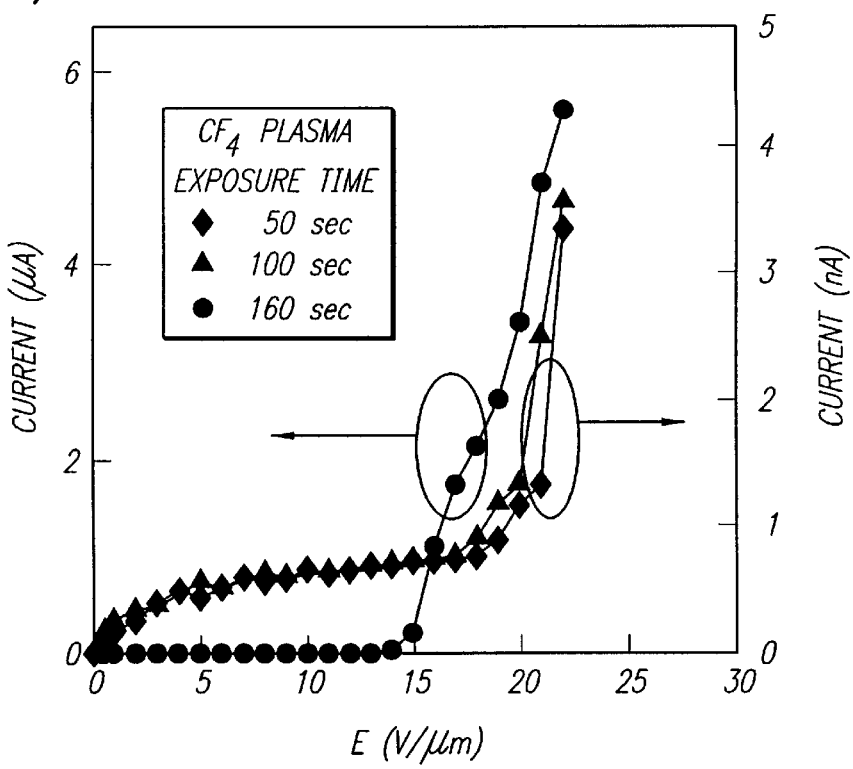
FIG. 7 shows changes in characteristics of the DLC films with varied exposure time.

FIG. 7 shows the I-E characteristics of the DLC films according to the present invention with various $CF_4$ plasma exposure time. The area of the DLC films in the example was fixed at 0.3 $cm^2$. The emission current of the DLC film increases with the $CF_4$ plasma exposure time, together with decrease in emission threshold field. The onset field could be decreased by further optimization of the growth of DLC by using the method according to the present invention.

In another example, Mo tips field emitter array (FEA) is DLC coated by the layer-by-layer method according to the present invention. The Mo tips were deposited on silicon substrate using E-beam evaporator into 1.5 $\mu$m diameter holes spaced on 10 $\mu$m centers, which included sequential growing of $SiO_2$, Mo, and Al layers. The height of the tip relative to the gate is determined by the diameter of the hole and the thickness of the insulating layers. During deposition of the DLC layers, the substrate temperature was adjusted to room temperature under a pressure of 20 mTorr. A thin DLC layer of about 5 nm thickness was grown and then $CF_4$ plasma was exposed on the surface. The DLC deposition and CF₄ plasma exposure were repeated to obtain substantially hydrogen free DLC layer of 20 nm thickness. Especially, substantially hydrogen free DLC layer can be grown by layer-by-layer deposition method; i.e. deposition of 5 nm DLC layer and subsequent 200 seconds of CF₄ plasma exposure on each layer of 5 nm DLC layer.

Electron emission characteristics of the tips were measured using triode geometry. An anode plate was placed at 1 mm above the gate and was biased at 300 V. The variation of the anode and the gate current with the gate-to-cathode bias was measured under $1 \times 10^{-8}$ Torr vacuum environment. The current-voltage and current fluctuation tests can be controlled by a computer. For all the tests, the device is configured in a common emitter configuration with the emitter grounded, the anode at a positive voltage and the gate driven positive to turn the device on.

Figure 8:
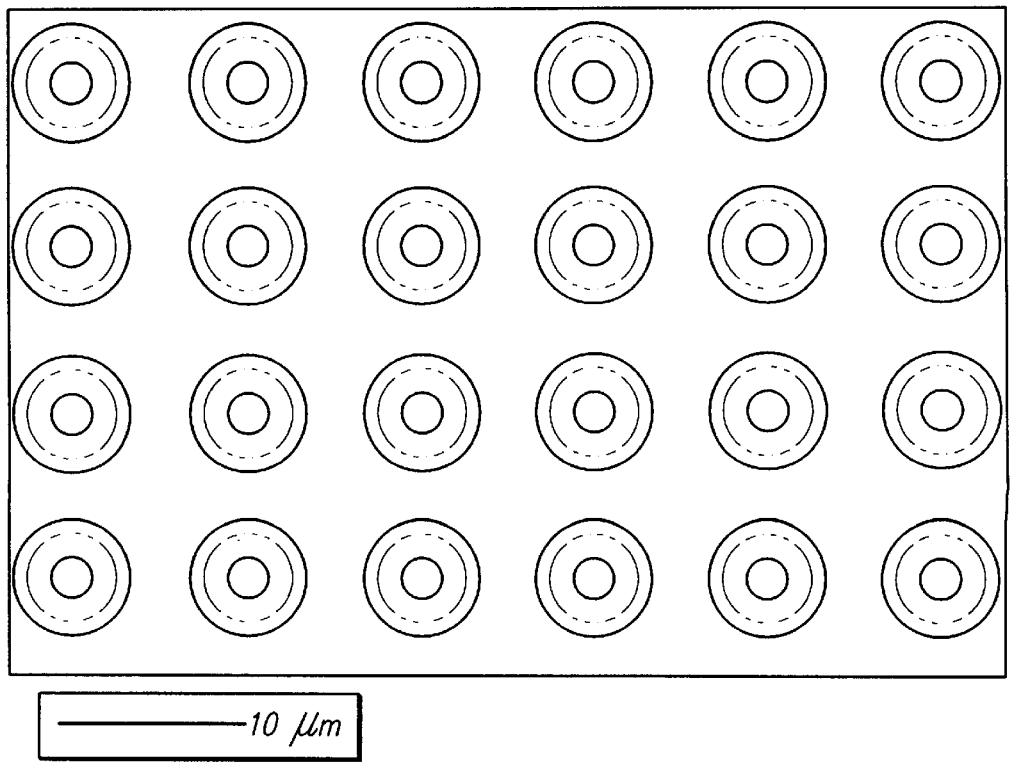
FIG. 8 is a top view SENI picture of DLC layer coated NMo FEAs.
Figure 9:
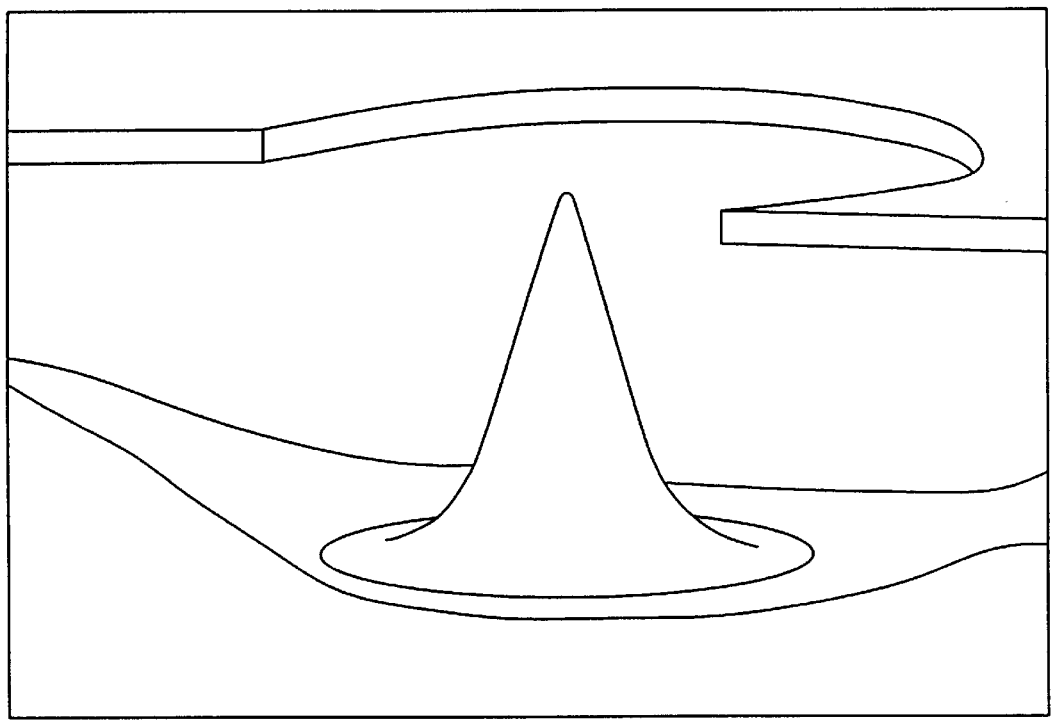
FIG. 9 is a cross-sectional SEM picture of the DLC layer coated Mo tip.

The morphologies of the substantially hydrogen free DLC coated Mo tips are shown in FIG. 8. The cross-sectional view of the substantially hydrogen free DLC coated Mo tips, shown in FIG. 9 reveals that the tips are typically 1.8 $\mu$m high and the gate aperture is 1.5 $\mu$m wide. The thermal SiO₂ dielectric layer is around 1.6 $\mu$m in thickness and the thickness of the substantially hydrogen free DLC coated on the Mo tips is about 20 nm.

Figure 10:
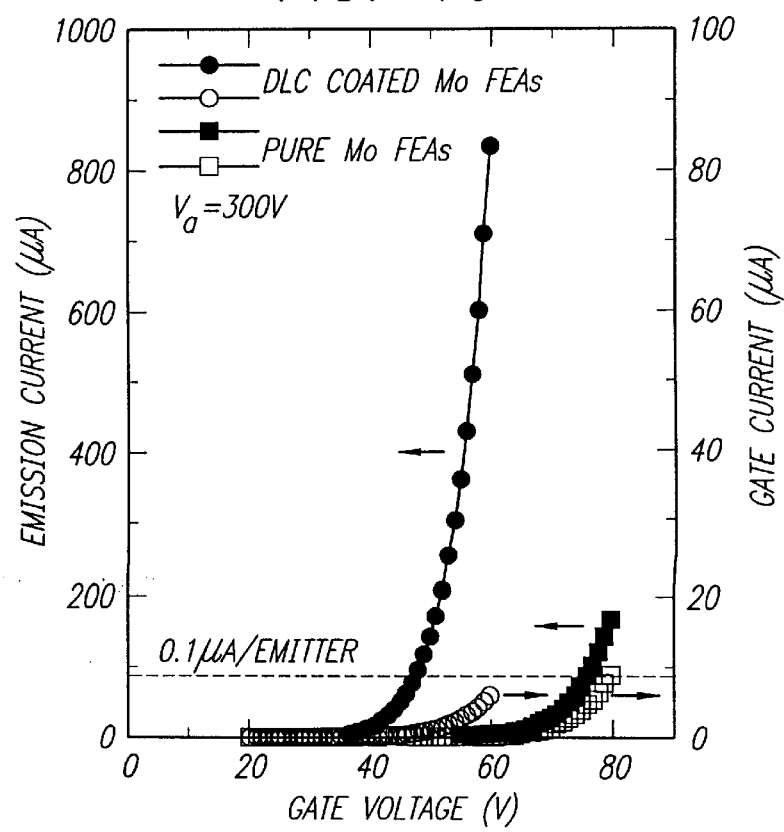
FIG. 10 shows I-V characteristics of the DLC layer coated Mo tips and Mo tips FEA.

FIG. 10 shows the emission current voltage characteristics for the DLC coated Mo tips FEA of 900 tips and the Mo tips FEA. The turn-on voltage was measured 80 V for the Mo tips FEA and 65 V for the DLC coated Mo tips FEA. In addition to the decrease in the turn-on voltage, the maximum anode current available also increased from 140 $\mu$A to 320 $\mu$A. And an anode current of about 0.1 $\mu$A per emitter is achieved at 87 V in the DLC coated Mo tips FEA, while the same current level is obtained at 107 V in the Mo tips FEA. This indicates that the operating voltage can be remarkably reduced just by adopting this fabrication process of the DLC coating on the Mo tips. By contrast, the gate current monotonously increased with the applied gate voltage and was not significantly altered because of the DLC coating. It should be noted that these Mo and the DLC coated Mo tips were grown on the same wafers under the same condition. The modification on the current-voltage property can, thus, be completely attributed to the enhancement on the electron emission behavior due to the substantially hydrogen free DLC coating.

Figure 11:
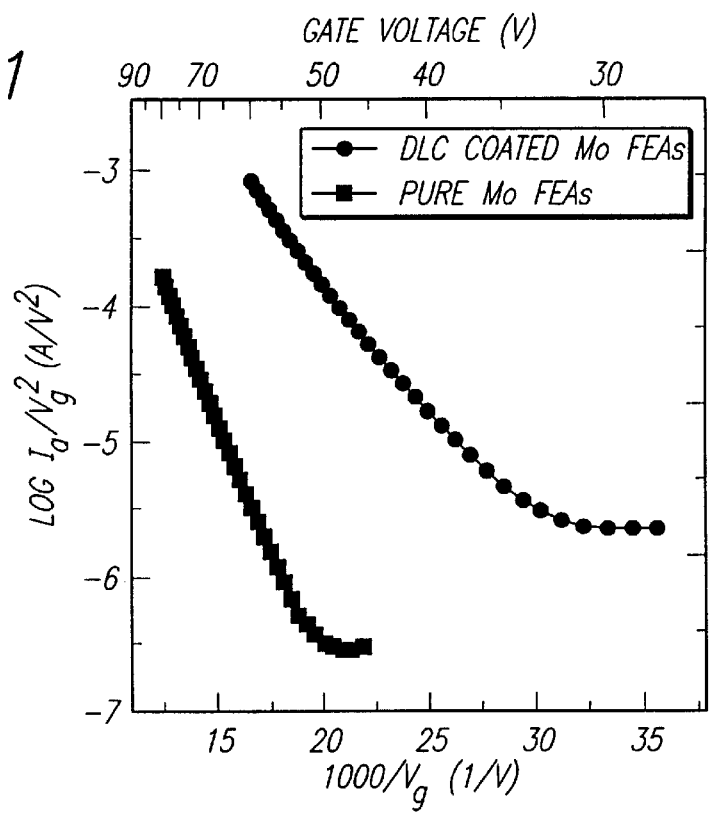
FIG. 11 shows Fowler-Nordheim plots of the DLC layer coated Mo tips and Mo tips FEA.

FIG. 11 shows the Fowler-Nordheim plots of the DLC coated Mo tips FEA and Mo tips FEA. The electron emission characteristics of the tips were further evaluated using the Fowler-Nordheim Equation, that is, $$\log(I/V^2) = \log A - B \times (1000/V),$$

where I is the emission current, V is the gate to cathode voltage, log A is the intersection with vertical axis, and B the slope of the F-N plot which is proportional to $\phi^{3/2}$. The effective work-function ($\phi$), and turn-on voltage estimated from the slop of the F-N plots and the intercepts of this plot with the abscissa, respectively. The field enhanced factor for these tips was first obtained by comparing $\phi$ value calculated from the slope of the F-N plots of the Mo tips with the work-function reported for Mo metal (4.5 eV). The effective $\phi$ value thus calculated for the DLC coated tips is 2.60 eV. These observations illustrated the significant effect of the substantially hydrogen free DLC coating on lowering the work-function required for emitting the electrons.

Figure 12A:
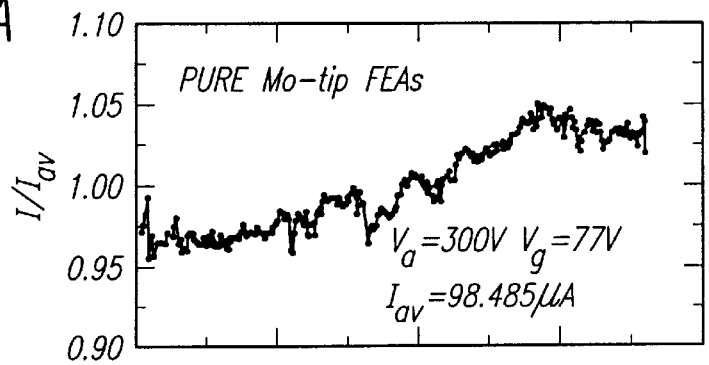
FIGS. 12A–12B shows emission current fluctuation of pure Mo FEAs and the DLC layer coated Mo FEAs.
Figure 12B:
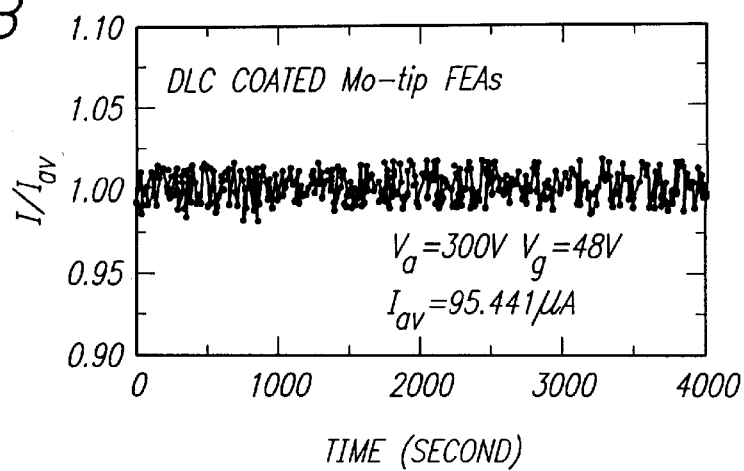

The emission current fluctuations of Mo tips FEA and the substantially hydrogen free DLC coated Mo tips FEA with variable gate voltage are shown in FIG. 12A and FIG. 12B, respectively. It was confirmed that, in the measurement of midterm current fluctuation, the emission current of the substantially hydrogen free DLC coated Mo tips FEA is more stable than that of the conventional pure Mo tips FEA. So the performance of the DLC coated Mo-tips FEA is better than that of the Mo tips FEA.

Electron emission characteristics of the Mo tips and the substantially hydrogen free DLC coated Mo tips FEA have been examined using triode geometry, DLC coatings are observed to have markedly enhance the emission of electrons. The turn-on voltage is reduced from 80 to 65 V, while the maximum anode current increased from 140 to 320 $\mu$A, due to DLC coating on Mo tips. And the emission current for the substantially hydrogen free DLC coated Mo tips is more stable than that of the conventional pure Mo tips FEA.

Considering the above, the substantially hydrogen free DLC film formed by method according to the present invention provides a promising cathode material especially for FED, due to its characteristics of hardness, chemical inertness, the excellent thermal conductivity, large area capable low-field cold emission and emission stability.

Obviously, numerous modifications and variations of the present invention are possible in light of the above teaching. It is therefore to be understood that the invention may be practiced otherwise than as specifically described herein.

What is claimed is:

1. A method of forming substantially and uniformly hydrogen free DLC films on a substrate comprising the steps of:

growing a DLC film containing hydrogen and having a predetermined thickness on the substrate;

exposing the surface of the DLC film to etching plasma in an atmosphere containing fluorine gas to make said DLC film containing hydrogen substantially and uniformly hydrogen free; and repeating said growing and exposing in that order over the preformed said substantially and uniformly hydrogen free DLC film to obtain a predetermined thickness of the DLC films.

2. The method according to claim 1, characterized in that the fluorine gas is carbon fluoride.

3. The method according to claim 2, characterized in that the carbon fluoride is CF₄.

4. The method according to claim 1, characterized in that the thickness of the DLC film is 1 to 100 nanometers.

5. The method according to claim 1, characterized in that the thickness of the DLC film is 5 to 20 nanometers.

6. The method according to claim 1, characterized in that the DLC film is exposed to the etching plasma for 1 to 200 sec.

7. The method according to claim 1, characterized in that the DLC film is exposed to the etching plasma for 50 to 100 sec.

8. The method according to claim 1, characterized in that the DLC film is grown by PECVD method using deposition plasma.

9. The method according to claim 8, characterized in that the deposition plasma for the growing of the DLC film comprises CH₄, H₂ and He.

10. The method according to claim 8, characterized in that the etching plasma comprises CF₄ and He.

* * * * *